US009989826B2

(12) United States Patent
Cho et al.

(10) Patent No.: US 9,989,826 B2
(45) Date of Patent: Jun. 5, 2018

(54) LIQUID-CRYSTAL DISPLAY DEVICE AND METHOD OF FABRICATING THE SAME

(71) Applicant: Samsung Display Co. Ltd., Yongin-si (KR)

(72) Inventors: Young Bong Cho, Seongnam-si (KR); Chang Hun Kwak, Suwon-si (KR); Hye Ran Mun, Yangju-si (KR); Dae Youn Park, Cheonan-si (KR); Sang Hun Lee, Suwon-si (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 126 days.

(21) Appl. No.: 15/148,650

(22) Filed: May 6, 2016

(65) Prior Publication Data

US 2017/0097538 A1  Apr. 6, 2017

(30) Foreign Application Priority Data

Oct. 2, 2015  (KR) .................. 10-2015-0138970

(51) Int. Cl.
| | |
|---|---|
| *G02F 1/1362* | (2006.01) |
| *H01L 27/32* | (2006.01) |
| *G02F 1/1335* | (2006.01) |
| *G02F 1/1339* | (2006.01) |
| *G02F 1/1343* | (2006.01) |
| *H01L 27/12* | (2006.01) |

(52) U.S. Cl.
CPC .... *G02F 1/136209* (2013.01); *G02F 1/13394* (2013.01); *G02F 1/133512* (2013.01); *G02F 1/133514* (2013.01); *G02F 1/134309* (2013.01); *G02F 1/136286* (2013.01); *H01L 27/124* (2013.01); *H01L 27/1259* (2013.01); *H01L 27/326* (2013.01); *H01L 27/3272* (2013.01)

(58) Field of Classification Search
CPC ......... G02F 1/136209; G02F 1/133512; G02F 1/134309; H01L 27/3272; H01L 27/326; H01L 27/1259
See application file for complete search history.

(56) References Cited

U.S. PATENT DOCUMENTS

| | | | |
|---|---|---|---|
| 6,218,272 B1 | 4/2001 | Yeom et al. | |
| 2017/0045782 A1* | 2/2017 | Cho | ................ G02F 1/133514 |
| 2017/0082885 A1* | 3/2017 | Lee | ................... G02F 1/13394 |

FOREIGN PATENT DOCUMENTS

| | | |
|---|---|---|
| KR | 100425483 | 3/2004 |
| KR | 1020080003108 | 1/2008 |

* cited by examiner

*Primary Examiner* — Joseph C Nicely
(74) *Attorney, Agent, or Firm* — Cantor Colburn LLP

(57) ABSTRACT

A liquid crystal display device includes: a first substrate on which a display area and a non-display area surrounding the display area are defined; a plurality of gate lines disposed in the display area and extending in a first direction; a plurality of data lines disposed in the display area and extending in a second direction, the data lines intersecting the gate lines; and a black matrix extending in the first line to cover the gate lines or in the second direction to cover the data lines, where a width of the black matrix at a location adjacent to a boundary line between the display area and the non-display area is larger than a width of the black matrix at a location adjacent to a center of the display area.

11 Claims, 12 Drawing Sheets

LIQUID-CRYSTAL DISPLAY DEVICE AND METHOD OF FABRICATING THE SAME

This application claims priority to Korean Patent Application No. 10-2015-0138970, filed on Oct. 2, 2015, and all the benefits accruing therefrom under 35 U. S.C. § 119, the content of which in its entirety is herein incorporated by reference.

BACKGROUND

1. Field

The disclosure relates to a liquid-crystal display ("LCD") device and a method of fabricating the LCD.

2. Description of the Related Art

Display devices have become more and more important as multimedia technology evolves. Accordingly, a variety of types of display devices such as LCD devices and organic light-emitting display ("OLED") devices are widely used.

Among others, an LCD device is one of the most widely used types of flat display devices. An LCD device typically includes two substrates in which field generating electrodes such as a pixel electrode and a common electrode are disposed, and a liquid-crystal layer disposed therebetween. In such an LCD device, voltage is applied to field generating electrodes to generate electric field across a liquid-crystal layer, and liquid-crystal molecules in the liquid-crystal layer are aligned by the electric field to control the polarization of incident light, to display an image.

SUMMARY

Typically, a liquid crystal display ("LCD") device displays an image by receiving light from a backlight unit. In order for an LCD device to display a desired image accurately, light is desired to be controlled precisely, e.g., to block light provided from a backlight unit so that undesirable light transmission is effectively prevented. To block light, a black matrix is widely employed in LCD devices. However, as display devices are becoming larger and thinner, it becomes more difficult to precisely control the position of the black matrix therein.

Embodiments of the invention relate to an LCD device in which light leakage from the outer periphery of a display area is effectively prevented.

Embodiments of the invention relate to a method of fabricating an LCD device in which light leakage from the outer periphery of a display area is effectively prevented.

According to an exemplary embodiment of the invention, a liquid-crystal display ("LCD") device includes: a first substrate on which a display area and a non-display area surrounding the display area are defined; a plurality of gate lines disposed in the display area and extending in a first direction; a plurality of data lines disposed in the display area and extending in a second direction, where the data lines intersects the gate lines; and a black matrix extending in the first line to cover the gate lines or in the second direction to cover the data lines. In such an embodiment, a width of the black matrix at a location adjacent to a boundary line between the display area and the non-display area is larger than a width of the black matrix at a location adjacent to a center of the display area.

In an exemplary embodiment, the black matrix may include a gate black matrix covering the gate lines.

In an exemplary embodiment, the LCD device may further include: a source electrode and a drain electrode, which include substantially the same material as a material of the data lines.

In an exemplary embodiment, the gate black matrix may cover the source electrode and the drain electrode.

In an exemplary embodiment, the LCD device may further include: a color filter disposed on the source electrode and the drain electrode.

In an exemplary embodiment, the LCD device may further include a pixel electrode disposed on the color filter.

In an exemplary embodiment, the black matrix may further include a data black matrix covering the data lines. In such an embodiment, a width of the gate black matrix may be larger than a width of the data black matrix.

In an exemplary embodiment, the display area and the non-display area may be divided by first and second boundary lines, where the first boundary line extends in the first direction and the second boundary line extends in the second direction. In such an embodiment, first to third columns extending in the second direction may be defined in the display area sequentially from the second boundary line, and a width of the black matrix may increase stepwise from in the third column to in the first column.

In an exemplary embodiment, the display area and the non-display area may be divided by first and second boundary lines, where the first boundary line extends in the first direction and the second boundary line extends in the second direction. First to third rows extended in the first direction may be defined in the display area sequentially from the first boundary line, and a width of the black matrix may increase stepwise from in the third row to in the first row.

In an exemplary embodiment, the display area and the non-display area may be divided by first and second boundary lines, the first boundary line extended in the first direction and the second boundary line extended in the second direction. In such an embodiment, the black matrix may include a gate black matrix extending in the first direction and a data black matrix extending in the second direction. In such an embodiment, the gate black matrix may include an area in which a width thereof deceases from the second boundary line to the center of the display area, and the data black matrix may include an area in which a width thereof deceases from the first boundary line to the center of the display area.

In an exemplary embodiment, the LCD device may include further include: a plurality of pixels, each of which is connected to a corresponding data line and a corresponding gate line. In such an embodiment, at least a portion of each of the plurality of pixels may be exposed by the black matrix.

According to another exemplary embodiment of the invention, a method of fabricating an LCD device includes: preparing a first substrate on which a display area and a non-display area surrounding the display area are defined, where the first substrate includes; gate lines extending in a first direction; data lines extending in a second direction and intersecting the gate lines; a color filter disposed on a pixel area defined by the respective gate lines and data lines; and a pixel electrode disposed on the color filter; providing a light-blocking layer on the pixel electrode and the color filter on the first substrate; providing a photoresist pattern on the light-blocking layer; and etching the light-blocking layer using the photoresist pattern as an etch mask to form a black matrix, where a width of the black matrix at a location adjacent to a boundary line between the display area and the non-display area is larger than a width of the black matrix at a location adjacent to a center of the display area.

In an exemplary embodiment, the black matrix may further include a data black matrix covering the data lines.

In such an embodiment, a width of the gate black matrix may be larger than a width of the data black matrix.

In an exemplary embodiment, the display area and the non-display area may be divided by first and second boundary lines, where the first boundary line extends in the first direction and the second boundary line extends in the second direction. In such an embodiment, first to third columns extending in the second direction may be defined in the display area sequentially from the second boundary line, and a width of the black matrix may increase stepwise from in the third column to in the first column.

In an exemplary embodiment, the display area and the non-display area may be divided by first and second boundary lines, where the first boundary line extends in the first direction and the second boundary line extends in the second direction. In such an embodiment, first to third rows extended in the first direction may be defined in the display area sequentially from the first boundary line, and a width of the black matrix may increase stepwise from in the third row to in the first row.

In an exemplary embodiment, the display area and the non-display area may be divided by first and second boundary lines, where the first boundary line extends in the first direction and the second boundary line extends in the second direction. In such an embodiment, the black matrix may include a gate black matrix extending in the first direction and a data black matrix extending in the second direction, and the gate black matrix may include an area in which a width thereof deceases from the second boundary line to the center of the display area, and the data black matrix may include an area in which a width thereof deceases from the first boundary line to the center of the display area.

In an exemplary embodiment, the LCD device may include further include: a plurality of pixels, each of which is connected to a corresponding data line and a corresponding gate line. In such an embodiment, at least a portion of the plurality of pixels may be exposed by the black matrix.

According to exemplary embodiments of the disclosure, light leakage from the outer periphery of a display area of an LCD device may be effectively prevented.

In such embodiments, a sufficient width of a black matrix may be secured even when developing capability of a developer is changed during a development process.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the invention will become more apparent by describing in detail exemplary embodiments thereof with reference to the attached drawings, in which.

DETAILED DESCRIPTION

Figure 1:
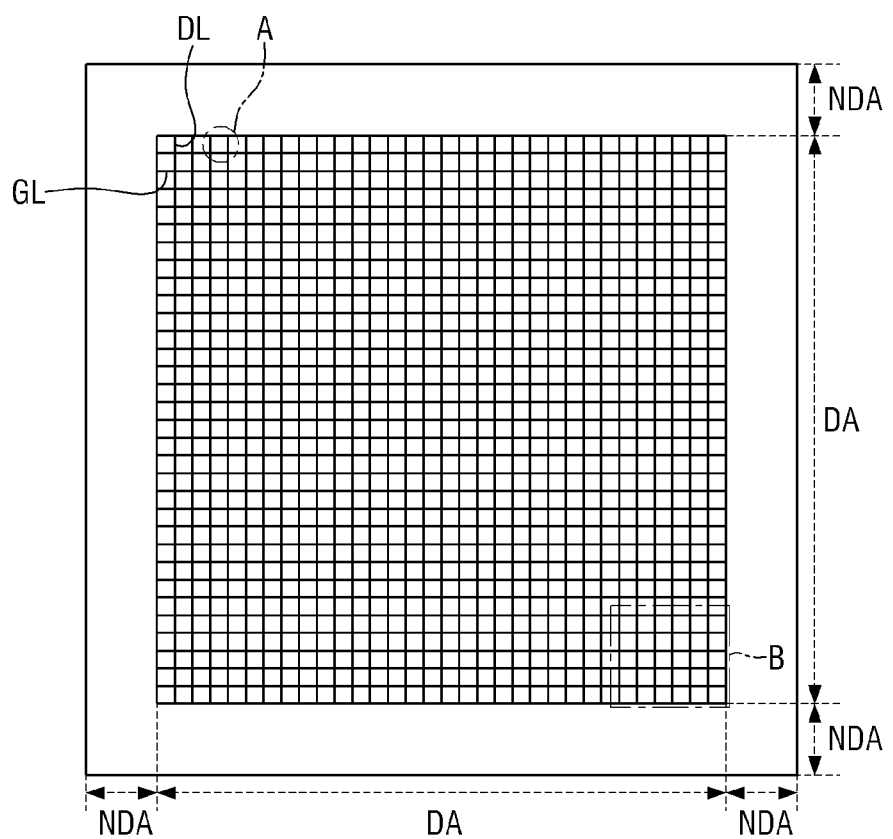
FIG. 1 is a schematic plan view of an LCD device according to an exemplary embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the attached drawings.

Figure 2:
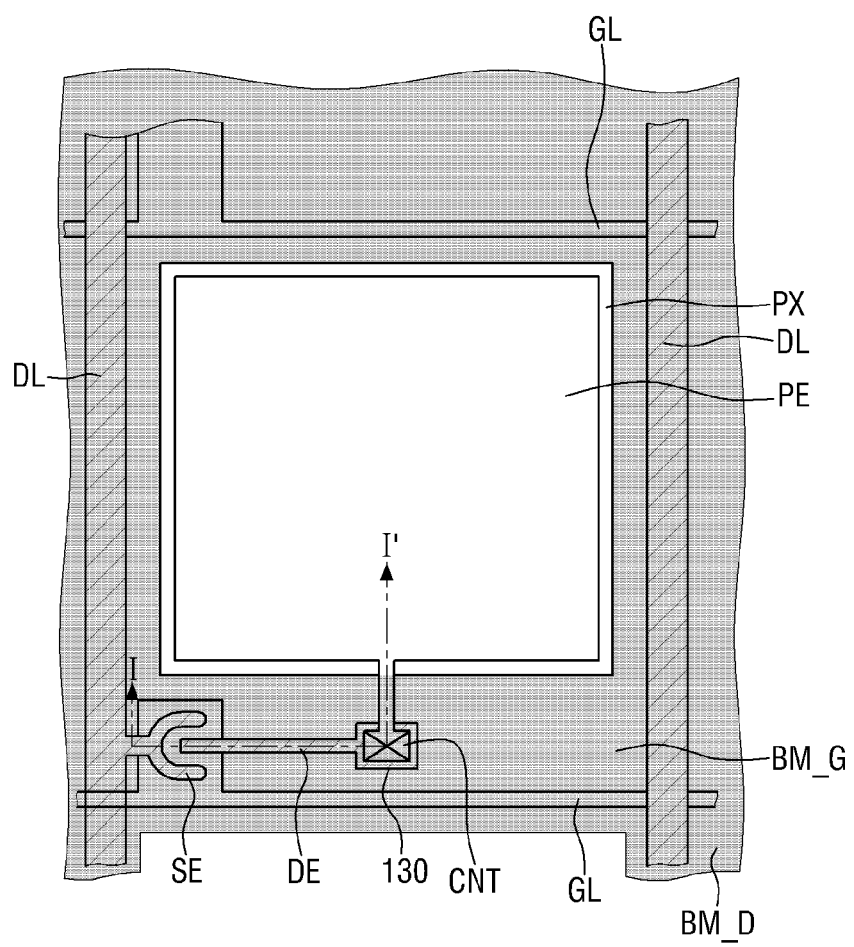
FIG. 2 is an enlarged view of portion A of FIG. 1.
Figure 3:
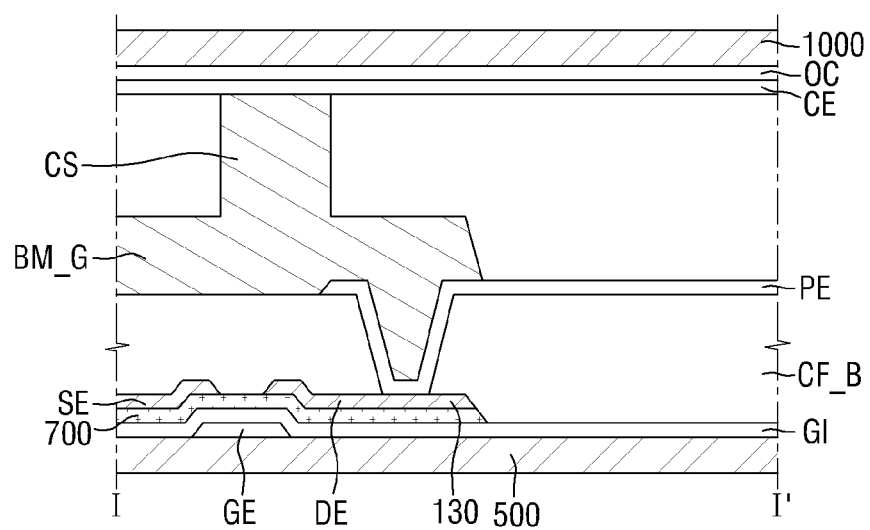
FIG. 3 is a cross-sectional view taken along line I-I' of FIG. 2.
Figure 4:
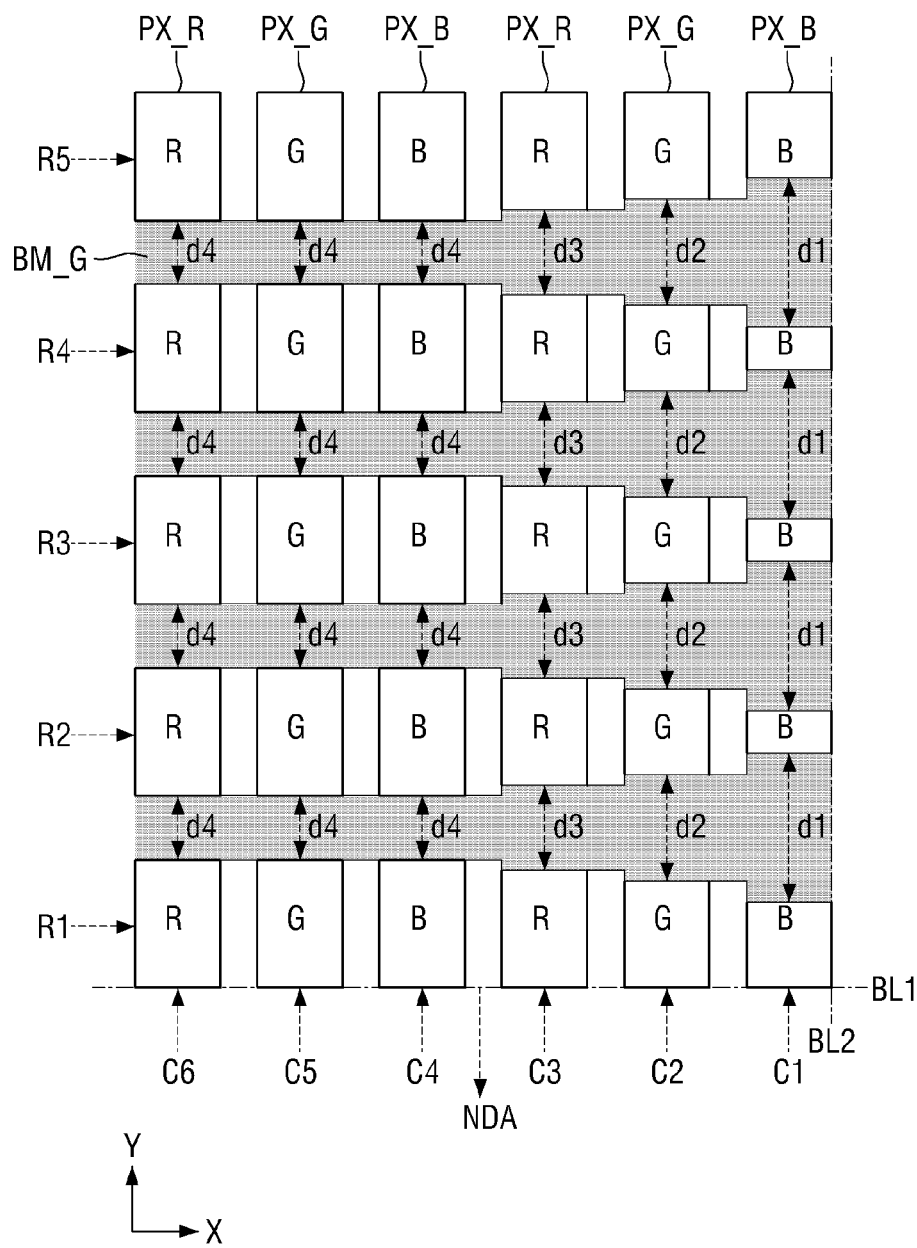
FIG. 4 is an enlarged cross-sectional view of portion B of FIG. 1.

FIG. 1 is a schematic plan view of an LCD device according to an exemplary embodiment of the disclosure. FIG. 2 is an enlarged view of portion A of FIG. 1. FIG. 3 is a cross-sectional view taken along line I-I' of FIG. 2. FIG. 4 is an enlarged cross-sectional view of portion B of FIG. 1.

Referring to FIGS. 1 to 4, an exemplary embodiment of an LCD device includes a first substrate 500 including a display area DA and a non-display area NDA surrounding the display area DA, a plurality of gate lines GL disposed on the first substrate 500 in the display area DA and extending in a first direction, a plurality of data lines DL disposed on the first substrate 500 in the display area DA and extending in a second direction to intersect the gate lines GL, and a black matrix BM extending in the first direction or the second direction to cover the gate lines GL or the data lines DL.

The first substrate 500 may include or be made of a material that is resistant to heat and is transparent. The first substrate 500 may include or be made of, but is not limited to, a transparent glass or plastic. The display area DA and the non-display area NDA are defined on the first substrate 500.

The display area DA refers to the area of the display device where an image is displayed. The non-display area NDA refers to the area of the display device where a variety of types of signal lines are disposed to display an image in the display area DA.

A plurality of pixels PX may be disposed in the display area DA, each of which is connected to a corresponding data line DL and a corresponding gate line GL intersecting one another. A pixel area may be defined in the display area DA by the respective data lines DL and the respective gate lines GL. FIG. 2 is an enlarged view of one of the plurality of pixels PX. The plurality of pixels PX disposed in the display area DA may have substantially the same configuration as that shown in FIG. 2.

Referring to FIGS. 2 and 3, gate wiring GL and GE may be disposed on the first substrate 500. The gate wiring GL and GE may include a gate line GL that receives a signal for driving, a gate electrode GE protruding from the gate line GL in the form of a protrusion, and a gate end (not shown) disposed at least one end of the gate line GL.

The gate line GL may extend in the first direction. The first direction may be substantially identical to the x-direction of FIG. 2. The gate electrode GE is one of three terminals of a thin-film transistor. The other two terminals, e.g., a source electrode SE and a drain electrode DE, of the thin-film transistor will be described below.

The gate wiring GL and GE may include at least one selected from: an aluminum-based metal including an aluminum alloy; a silver-based metal including a silver alloy; a copper-based metal including a copper alloy; a molybdenum (Mo)-based metal including a molybdenum alloy; chrome (Cr); titanium (Ti); and tantalum (Ta). The material of the gate wiring GL and GE is not limited to those listed above. In an alternative exemplary embodiment, other metals or polymer materials may be used as the material of the gate lines GL and GE.

The gate wiring GL and GE may have a single layer structure, e.g. a single film structure, but not being limited thereto. In an alternative exemplary embodiment, the gate lines GL and GE may be a multi-layer structure, e.g., a double-layer or a triple-layer structure.

A gate insulation film GI may be disposed on the gate wiring GL and GE. The gate insulation film GI may cover the gate wiring GL and GE, and may cover substantially the entire surface of the first substrate 500.

The gate insulation film GI may be formed by mixing at least one material selected from: an inorganic insulative material such as silicon oxide ($SiO_x$) and silicon nitride ($SiN_x$); and an organic insulative material such as benzocyclobutene ("BCB"), an acryl-based material and polyimide. However, the material of the gate insulation film GI is not limited to those listed above.

A semiconductor pattern layer 700 may be disposed on the gate insulation film GI.

The semiconductor pattern layer 700 may include amorphous silicon or polycrystalline silicon, but the material of the semiconductor pattern layer 700 is not limited thereto. In an alternative exemplary embodiment, the semiconductor pattern layer 700 may include oxide semiconductor.

The semiconductor pattern layer 700 may have a variety of shapes such as an island shape or a line shape. In an exemplary embodiment, where the semiconductor pattern layer 700 has the line shape, the semiconductor pattern layer 700 may be disposed under the data line DL to extend to a top of the gate electrode GE.

In an exemplary embodiment, the semiconductor pattern layer 700 may be patterned in substantially the same shape as the data wiring DL, SE, DE and 130 except a portion thereof in which a channel CH is formed, which will be described below. In such an embodiment, the semiconductor pattern layer 700 may be disposed to overlap the data wiring DL, SE, DE and 130 except a portion thereof in which the channel CH is formed. The channel CH may be disposed between the source electrode SE and the drain electrode DE facing each other. The channel CH electrically connects the source electrode SE to the drain electrode DE, and the shape of the channel CH is not particularly limited.

An ohmic contact layer (not shown) may be disposed on the semiconductor pattern layer 700, which is highly doped with an n-type impurity. The ohmic contact layer may overlap the semiconductor pattern layer 700 partially or completely. In an alternative exemplary embodiment, where the semiconductor pattern layer 700 includes an oxide semiconductor, the ohmic contact layer may be omitted.

In an exemplary embodiment, the data wiring DL, SE, DE and 130 may be disposed on the semiconductor pattern layer 700. The data wiring DL, SE, DE and 130 may include: a data line DL extending in a second direction, e.g., y-axis direction of FIG. 2, to intersect the gate line GL; a source electrode SE branching off from the data line DL to extend to the top of the semiconductor pattern layer 700; a drain electrode DE spaced apart from the source electrode SE and facing the source electrode SE on the semiconductor pattern layer 700 with respect to the gate electrode GE or the channel; and a drain electrode extension 130 extending from the drain electrode DE to be electrically connected to a pixel electrode PE, which will be described below. The drain electrode extension 130 may have a larger width than the drain electrode DE, thereby facilitating electrical contact with the pixel electrode PE.

The data wiring DL, SE, DE and 130 may have a single-layer or a multi-layer structure, e.g., include a single film or multiple films including at least one selected from nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se) and tantalum (Ta), for example. In such an embodiment, the material of the data lines DL, SE, DE and 130 may include an alloy including at least one selected from titanium (Ti), zirconium (Zr), tungsten (W), tantalum (Ta), niobium (Nb), platinum (Pt), hafnium (Hf), oxygen (O) and nitrogen (N) to the metal. However, the material of the data wiring DL, SE, DE and 130 is not limited to those listed above.

Although FIG. 2 shows a single pixel having a thin-film transistor, those skilled in the art would understand that the disclosure is not limited thereto. In an alternative embodiment, a single pixel may include a plurality of thin-film transistors.

Referring to FIG. 3, a color filter CF may be disposed over the data wiring DL, SE, DE and 130 and the semiconductor pattern layer 700. The color filter layer CF may include at least one of a blue color filter, a green color filter and a red color filter. In an exemplary embodiment, the blue color filter, the green color filter and the red color filter may have different heights from one another.

A contact hole CNT, via which the drain electrode extension 130 is exposed, may be defined or formed in the color filter CF. The drain electrode extension 130 is exposed via the contact hole CNT, such that the pixel electrode PE may be electrically connected to the drain electrode DE, which will be described below.

The pixel electrode PE may be disposed on the color filter layer CF. The pixel electrode PE may be electrically connected to the drain electrode DE via the contact hole CNT defined in the color filter CF.

In an exemplary embodiment, the pixel electrode PE may include or be made of a transparent conductor such as indium tin oxide ("ITO") or indium zinc oxide ("IZO"), or a reflective conductor such as aluminum.

Although FIG. 2 shows an exemplary embodiment including the plate-like pixel electrode PE, the shape of the pixel electrode is not limited thereto. In an alternative exemplary embodiment, the pixel electrode PE may include at least one slit. In another alternative exemplary embodiment, the pixel electrode PE of a pixel may include a plurality of pixel electrodes, to which different voltages may be applied.

A black matrix BM may be disposed on the color filter CF and the pixel electrode PE. The black matrix BM may extend in the first direction to cover the gate line GL or may extend in the second direction to cover the data line DL.

The black matrix BM may block incident light from the outside or may block light from leaking from the periphery of a pixel. In such an embodiment, the black matrix BM may include or be made of a photosensitive resin including a black pigment. However, the material of the black matrix BM is not limited thereto.

Herein, a black matrix extending in the first direction may be referred to as a gate black matrix BM_G, and a black matrix extending in the second direction may be referred to as a data black matrix BM_D, for convenience of description. In an exemplary embodiment, the black matrix BM herein may include the gate black matrix BM_G and the data black matrix BM_D.

The gate black matrix BM_G extending in the first direction may cover the source electrode SE, the drain electrode DE and the channel CH. In such an embodiment, the gate black matrix BM_G may cover pixels or at least a portion thereof. In such an embodiment, the width of the gate black matrix BM_G may be greater than the width of the gate line GL.

The data black matrix BM_D extending in the second direction may extend along the data lines DL and may overlap the data lines DL. In an alternative exemplary embodiment, the data black matrix BM_D may be omitted.

The width of the data black matrix BM_D may be less than the width of the gate black matrix BM_G. In such an embodiment, the area covered by the gate black matrix BM_G is larger than the area covered by the data black matrix BM_D.

The black matrix BM will be described in greater detail with reference to FIG. 4.

Referring to FIG. 4, a plurality of pixels PX may be arranged in a matrix form including rows and columns.

The plurality of pixels PX may be arranged along the rows and columns. As described above, a color filter layer CF disposed in a pixel may include at least one of a red color filter, a green color filter and a blue color filter. In one exemplary embodiment, for example, the pixel PX may one of a red pixel PX_R, a green pixel PX_G and a blue pixel PX_B based on the color of the color filter CF thereof. The pixels PX may include the red pixel PX_R, the green pixel PX_G and the blue pixel PX_B.

The red pixel PX_R, the green pixel PX_G and the blue pixel PX_B may be arranged in a regular or random sequence. In an exemplary embodiment, as shown in FIG. 4, red pixels PX_R, green pixels PX_G and blue pixels PX_B are sequentially and repeatedly arranged in the row direction (the first direction) while pixels of the same color are arranged in the column direction (the second direction). However, the arrangement of the pixels PX is not limited to that shown in FIG. 4. In one alternative exemplary embodiment, for example, red pixels PX_R, green pixels PX_G and blue pixels PX_B may be arranged in a variety of combinations.

The black matrix BM may be disposed between two adjacent pixels PX. For each pixel PX, the black matrix BM is disposed along the periphery of a pixel PX while exposing the center portion of the pixel PX. Light from a back light unit is incident on the center portion exposed via the black matrix BM, such that the pixel may emit light of red, blue or green.

For convenience of description, some terms are defined herein. Initially, a boundary between the display area DA and the non-display area NDA will be defined. Specifically, the display area DA and the non-display area NDA may be divided by a first boundary line BL1 extending in the first direction and a second boundary line BL2 extending in the second direction. In an exemplary embodiment, the display area DA may have a closed quadrangular shape defined by two first boundary lines BL1 and two second boundary lines BL2.

A plurality of columns that extends in parallel with the second boundary line BL2 is defined. The plurality of pixels PX may be arranged along the plurality of columns. A column closest to the second boundary line BL2 may be referred to as a first column C1, and columns on an inner side of the first column C1 and sequentially being away from the first column C1 may be referred to as a second column C2, a third column C3, a fourth column C4, a fifth column C5 and a sixth column C6, respectively.

A plurality of rows that extends in parallel with the first boundary line BL1 may be defined. The plurality of pixels PX may be arranged along the plurality of rows. A row closest to the first boundary line BL1 may be referred to as a first row R1, and rows on an inner side of the first row R1 and being sequentially away from the first row R1 may be referred to as a second row R2, a third row R3, a fourth row R4, a fifth row R5 and a sixth row C6, respectively.

Accordingly, a pixel disposed in the first column C1 and in the first row R1 may be disposed at a corner of the display area DA.

The gate black matrix BM_G may extend in the first direction. In an exemplary embodiment, as shown in FIG. 4, the width of the black matrix BM_G extending in the first direction may increase stepwise from the center portion of the display area DA to the second boundary line BL2. In such an embodiment, the width of the black matrix BM_G at a location closest to the second boundary line BL2 may be greater than the width of the black matrix BM_G at the center portion of the display area DA.

As used herein, the center portion of the display area DA may refer to the center of the display area DA or an area around the center of the display area DA.

The width of black matrix BM_G increasing stepwise may be achieved by an exemplary embodiment of a method of fabricating an LCD device, which will be described below. Such an embodiment of the method for fabricating an LCD device may include exposure and development processes using a photoresist pattern.

In such an embodiment, the developing capability of a developer is higher near the non-display area NDA than in the center portion of the display area DA, which may be due to the degree of fatigue of the developer. That is, even when the same developer is applied onto the substrate, the amount to be developed by the developer may be different in the center portion of the display area DA and in the display area DA near the non-display area NDA. Accordingly, the black matrix BM may be overly etched in the display area DA near the non-display area NDA than in the center portion of the display area DA. As a result, light may leak from the black matrix BM disposed along the periphery of the display area DA, which is overly etched. In an exemplary embodiment, such light leakage may be suppressed by way of making the width of the black matrix BM_G at the location closest to the second boundary line BL2 larger than the width of the black matrix BM_G in the center portion of the display area DA.

The width of the black matrix BM_G will be defined in greater detail. As shown in FIG. 4, the width of the black matrix between pixels disposed in the first column C1 is referred to as a first width d1. Then, the widths of the black matrix between pixels disposed in the second column C2, the third column C3 and the fourth column C4 are referred to as a second width d2, a third width d3 and a fourth width d4, respectively.

In an exemplary embodiment, the width of the gate black matrix BM_G may become smaller from the first width d1 to the fourth width d4. In such an embodiment, the first width d1 may be the largest, and the fourth width d4 may be the smallest.

In an exemplary embodiment, the width of the gate black matrix BM_G may increase stepwise from the fourth column C4 to the first column C1.

The widths of the gate black matrix BM_G disposed between pixels in the fifth and sixth columns may be equal to the fourth width d4. In such an embodiment, the width of the gate black matrix BM_G between pixels disposed on an inner side of the sixth column may be equal to the fourth width d4. In such an embodiment, the width of the gate black matrix BM_G may be equal to each other from the center portion of the display area DA to the fourth column C4, and then may increase stepwise from the third column C3 to the first column C1.

Accordingly, in such an embodiment, an aperture of each of the pixels disposed in the first column C1, e.g., a part which is not covered by the black matrix BM in each of the pixels, may be smaller than that of each of the pixels disposed in the center portion of the display area DA.

In an exemplary embodiment, the size of the aperture of each of the pixels PX may increase stepwise from the first column C1 to the fourth column C4 and then may be substantially equal from the fourth column C4 to the center portion.

Referring back to FIG. 3, a column spacer CS may be disposed on the gate black matrix BM. The column spacer CS may protrude from the black matrix BM toward a second substrate 1000. The column spacer CS and the black matrix BM may be integrally formed as a single unitary and indivisible unit. In such an embodiment, the black matrix BM and the column spacer CS may be made of substantially the same material as each other. In such an embodiment, the LCD device may employ a black column spacer ("BCS").

The column spacer CS may maintain the cell gap between the first substrate 500 and the second substrate 1000, which will be described below.

The second substrate 1000 may be disposed to face the first substrate 500.

An overcoat film OC may be disposed on the second substrate 1000. The overcoat film OC may include or be made of an organic or inorganic material.

A common electrode CE may be disposed on the overcoat film OC. The common electrode may not be subjected to patterning, and the common electrode may have a plate-like shape. A common voltage may be applied to the common electrode CE. The orientation of liquid crystals between the first substrate 500 and the second substrate 1000 may be controlled by the electrical field generated between the common electrode CE and the pixel electrode PE.

Referring back to FIG. 1, the non-display area NDA will be described. A variety of types of lines for displaying an image on the display area DA may be disposed in the non-display area NDA. In an exemplary embodiment, a data pad (not shown) electrically connected to a data driving unit (not shown), and data fan-out lines (not shown) for connecting the data lines DL in the display area DA to the data pad may be disposed in the non-display area NDA.

In such an embodiment, gate pads (not shown) for connecting to a gate driving unit (not shown) and gate fan-out lines (not shown) for connecting the gate lines GL in the display area DA to the gate pads may be disposed on a side of the non-display area NDA.

A seal pattern (not shown) may be disposed in the non-display area NDA. The seal pattern may seal the first substrate 500 and the second substrate 1000. The seal pattern may be disposed in the non-display area NDA such that the seal pattern surrounds the outer periphery of the display area DA. In an exemplary embodiment where the display area DA has a quadrangular shape, the seal pattern may be disposed such that the seal pattern surrounds the four sides of the display area DA.

Hereinafter, an LCD device according to an alternative exemplary embodiment will be described. In the following description, the same elements as in the foregoing description will be denoted by like reference numerals, and any repetitive detailed descriptions thereof may be omitted or simplified.

Figure 5:
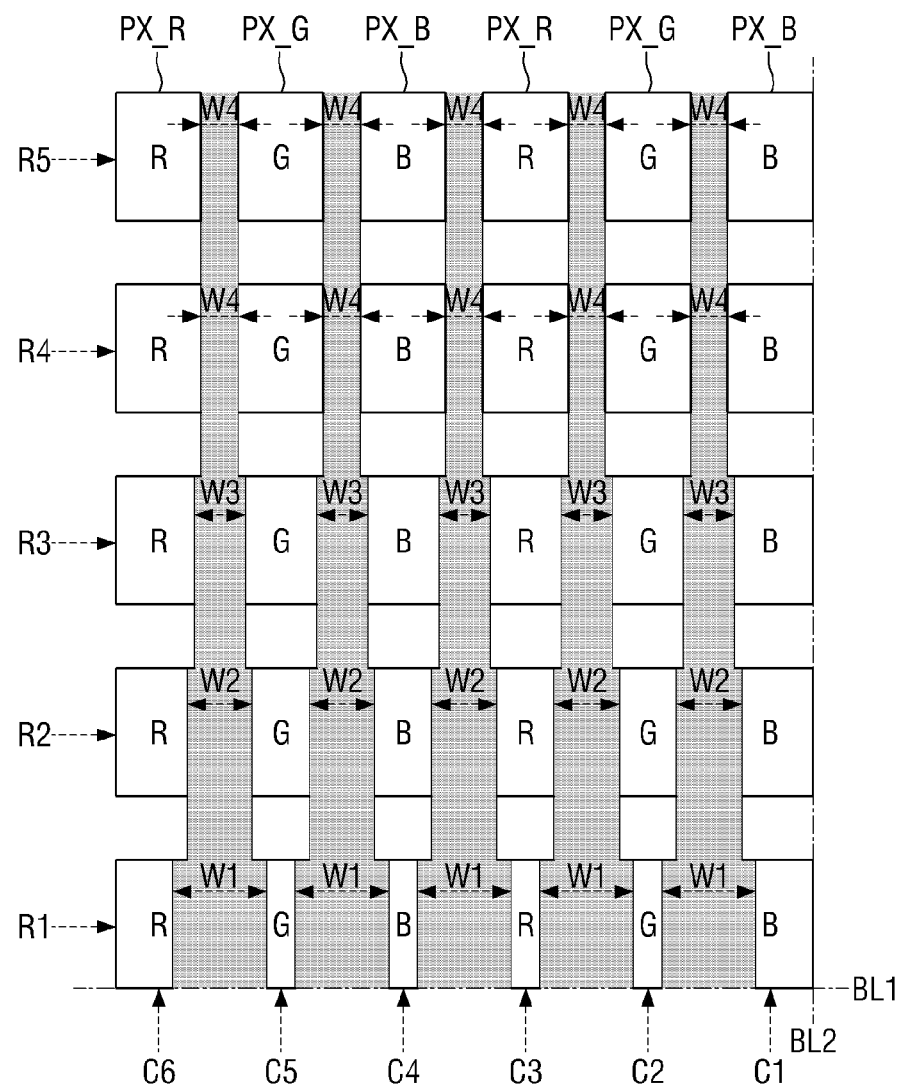
FIG. 5 is a schematic plan view of an LCD device according to an alternative exemplary embodiment of the disclosure.

FIG. 5 is a schematic plan view of an LCD device according to an alternative exemplary embodiment of the disclosure. Referring to FIG. 5, in an alternative exemplary embodiment of the LCD device, a black matrix BM_D extends along data lines DL.

In an exemplary embodiment, as shown in FIGS. 4 and 5, the black matrix BM may extend along gate lines GL to cover the gate lines GL or may extend along data lines DL to cover the data lines DL. In such an embodiment, the black matrix BM may extend in the first direction and the second direction to cover the gate lines GL and the data lines DL.

FIG. 5 shows an exemplary embodiment where the black matrix BM extends along the data lines DL to cover the data lines DL. As described, the black matrix BM extending along the data lines DL is referred to as the data black matrix BM_D.

In an exemplary embodiment, the data black matrix BM_D may extend in the second direction. The width of the data matrix BM_D extending in the second direction may increase stepwise from the center portion of the display area DA to the first boundary line BL1. In such an embodiment, the width of the data black matrix BM_D at a location closest to the first boundary line BL1 may be larger than the width of the data black matrix BM_D in the center portion of the display area DA.

The width of black matrix BM_D increasing stepwise may be achieved by an exemplary embodiment of a method of fabricating an LCD device, which will be described below. It is to be understood that such an embodiment of the method is merely illustrative and the scope of the disclosure is not limited thereto.

In such an embodiment, by making the width of the black matrix BM_D at the location closest to the first boundary line BL1 larger than the width of the data black matrix BM_D in the center portion of the display area DA as described above, light leakage from the outer periphery of the display area DA, which may occur when the data black matrix BM_D is overly etched, may be effectively prevented.

The width of the black matrix BM_D will be described in greater detail with reference to FIG. 5.

The width of the black matrix between pixels PX disposed in the first row R1 is referred to as a first width w1. Then, the widths of the black matrix between pixels PX disposed in the second row R2, the third row R3 and the fourth row R4 are referred to as a second width w2, a third width w3 and a fourth width w4, respectively.

The width of the data black matrix BM_D may become smaller from the first width w1 to the fourth width w4. That is, the first width w1 may be the largest, and the fourth width w4 may be the smallest.

In an exemplary embodiment, the width of the data black matrix BM_D may increase stepwise from the fourth row R4 to the first row R1.

The width of the black matrix BM_D between pixels PX disposed in the fifth row R5 may be equal to about the fourth width w4. Although not shown in the drawings, the width of the black matrix BM_D from a sixth row (not shown), which is located on an inner side of the fifth row R5, to the center portion of the display area DA may be equal to the fourth width w4. In such an embodiment, the width of the data black matrix BM_D may be equal from the center portion of the display area DA to the fourth row R4 and then may increase stepwise from the third row R3 to the first column R1.

Accordingly, an aperture of each of the pixels disposed in the first row R1, which is a part which is not covered by the black matrix BM in each of the pixels, may be smaller than that of each of the pixels disposed in the center portion of the display area DA.

In such an embodiment, the size of the aperture of each of the pixels PX may increase stepwise from the first row R1 to the fourth row R4 and then may be substantially equal from the fourth row R4 to the center portion of the display area DA.

The width of the data black matrix BM_D between pixels PX is increased from the third row R3 to the first R1 because the developing capability of a developer is higher near the first boundary line BL1 than in the center portion of the display area DA. Accordingly, in such an embodiment, light leakage near the boundary due to overly etched black matrix may be effectively prevented.

Figure 6:
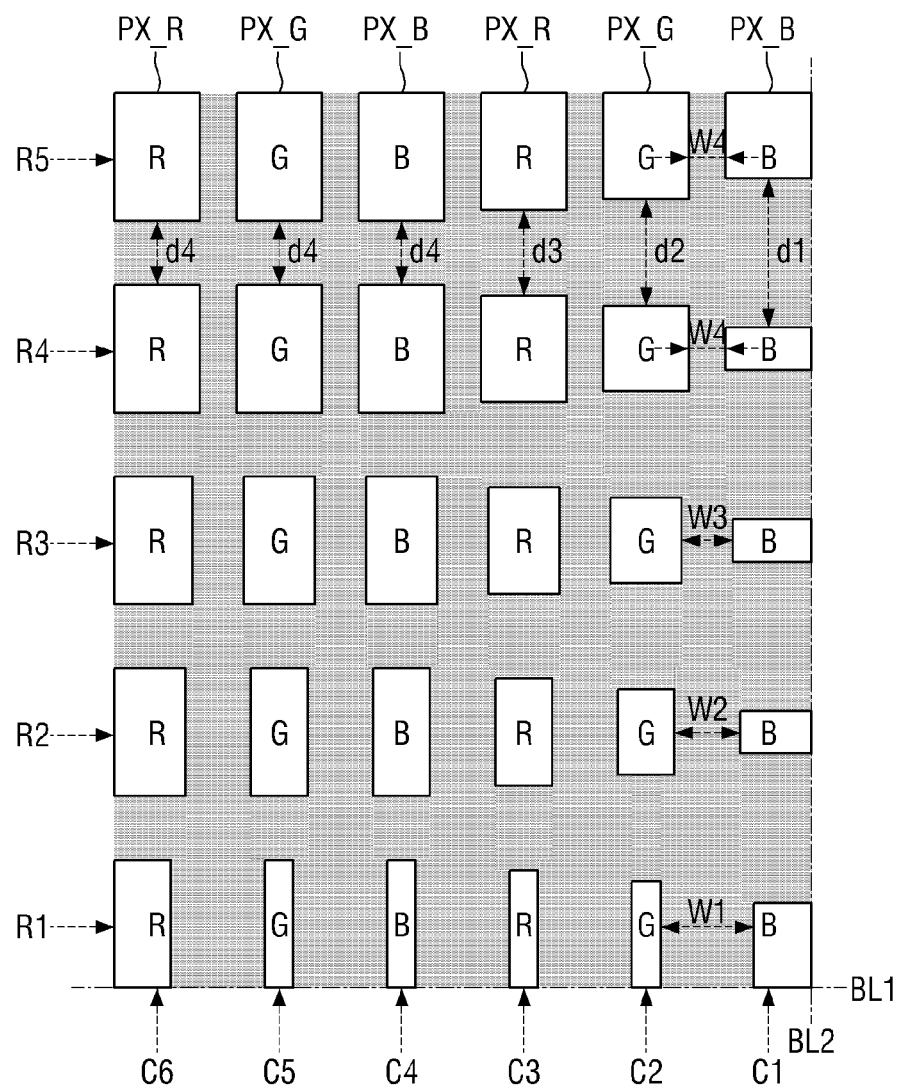
FIG. 6 is a schematically plan view of an LCD device according to another alternative exemplary embodiment of the disclosure.

FIG. 6 is a schematically plan view of an LCD device according to another alternative exemplary embodiment of the disclosure.

Referring to FIG. 6, in an exemplary embodiment of the LCD device, the black matrix BM includes both a gate black matrix BM_G extending in the first direction and a data black matrix BM_D extending in the second direction.

In some embodiments of the disclosure, the black matrix BM may include the gate black matrix BM_G extending along gate lines GL and the data black matrix BM_D extending along data lines DL.

The shape of the gate black matrix BM_G may be the same as that described above with respect to FIG. 4. The shape of the data black matrix BM_D may be the same as that described above with respect to FIG. 5. In such an embodiment shown in FIG. 6, the black matrix BM may correspond to a combination of the gate black matrix BM_G of FIG. 4 and the data black matrix BM_D of FIG. 5.

In such an embodiment where the black matrix BM includes the gate black matrix BM_G and the data black matrix BM_D as described above, light leakage occurring near the first boundary line BL1 in the display area DA, near the second boundary line BL2 in the display area DA, and near the point where the first boundary line BL1 meets the second boundary line BL2, which is the corner of the display area DA, may be effectively prevented.

Figure 7:
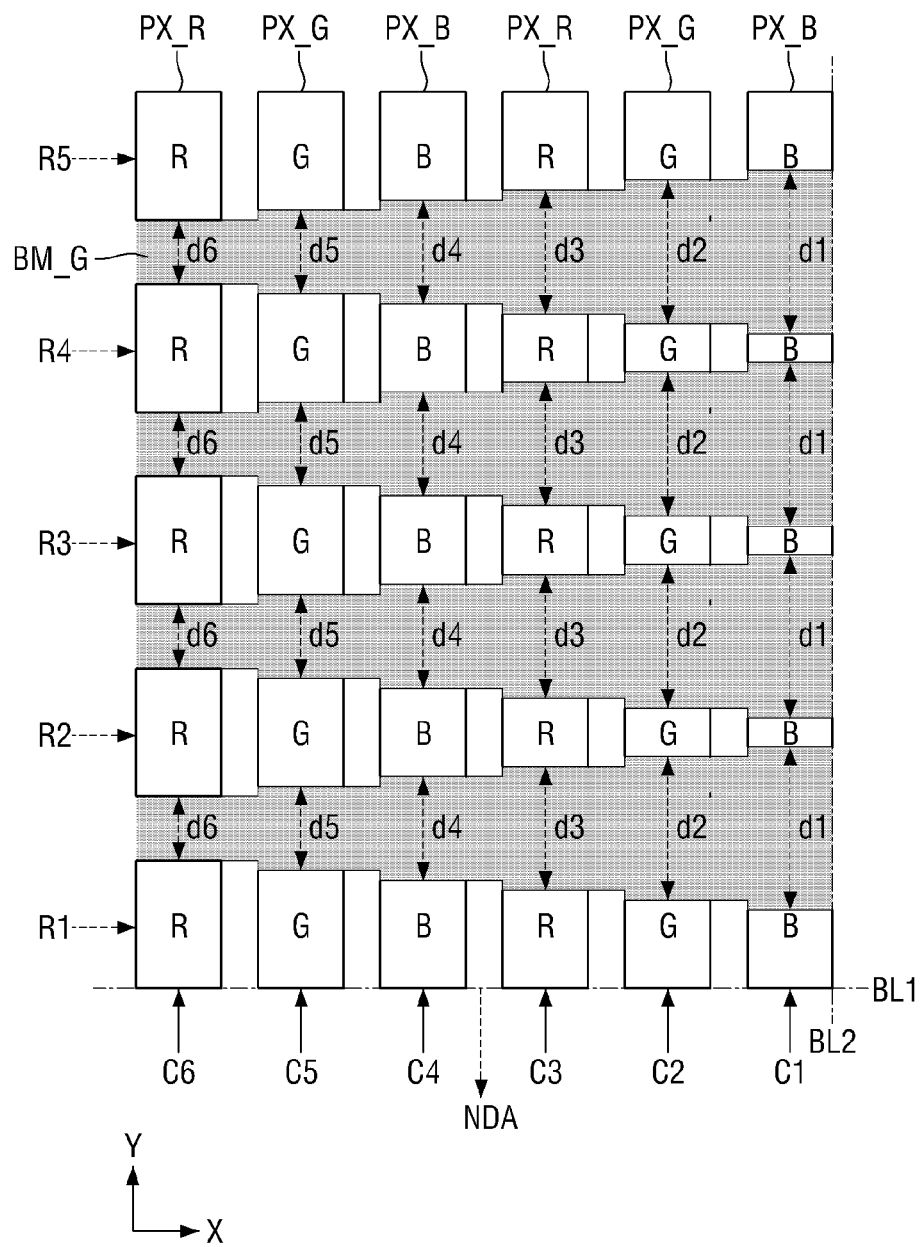
FIG. 7 is a schematically plan view of an LCD device according to another alternative exemplary embodiment of the disclosure.

FIG. 7 is a schematically plan view of an LCD device according to another alternative exemplary embodiment of the disclosure. Referring to FIG. 7, in an exemplary embodiment of the LCD device, the width of a gate black matrix BM_G increases stepwise from a sixth column C6 to a first column C1.

In an exemplary embodiment, as shown in FIG. 4, the width of the gate black matrix BM_G increases stepwise across three columns, which is merely illustrative. In an alternative exemplary embodiment, the width of the gate black matrix BM_G and/or the data black matrix BM_D may increase stepwise across more than three columns and/or rows.

FIG. 7 shows an exemplary embodiment where the width of the gate black matrix BM_G increases stepwise across five steps.

Hereinafter, the width of the black matrix between pixels disposed in the first column C1 is referred to as a first width d1. The widths of the black matrix between pixels disposed in the second column C2, the third column C3, the fourth column C4, the fifth column C5 and the sixth column C6 are referred to as a second width d2, a third width d3, a fourth width d4, a fifth width d5 and a sixth width d6, respectively.

In an exemplary embodiment, the width of the gate black matrix BM_G may become smaller from the first width d1 to the sixth width d6. In such an embodiment, the first width d1 may be the largest, and the sixth d6 may be the smallest.

In an exemplary embodiment, the width of the gate black matrix BM_G may increase stepwise from the sixth column C6 to the first column C1.

In an exemplary embodiment, the width of the gate black matrix BM_G between pixels PX disposed on an inner side of the sixth column C6 may be equal to the sixth width d6. In such an embodiment, the width of the gate black matrix BM_G may be equal from the center portion of the display area DA to the sixth column C6, and then may increase stepwise from the fifth column C5 to the first column C1.

Accordingly, an aperture of each of the pixels disposed in the first column C1, which is a part which is not covered by the black matrix BM in each of the pixels, may be smaller than that of each of the pixels disposed in the center portion of the display area DA.

In an exemplary embodiment, the size of the aperture of each of the pixels PX may increase stepwise from the first column C1 to the sixth column C6 and then may be substantially equal from the sixth column C6 to the center portion.

Hereinafter, an exemplary embodiment of a method of fabricating an LCD device will be described in detail. Some of elements described below may be identical to those of exemplary embodiments of the LCD device described above, and therefore, any repetitive detailed description thereof may be omitted or simplified.

Figure 8:
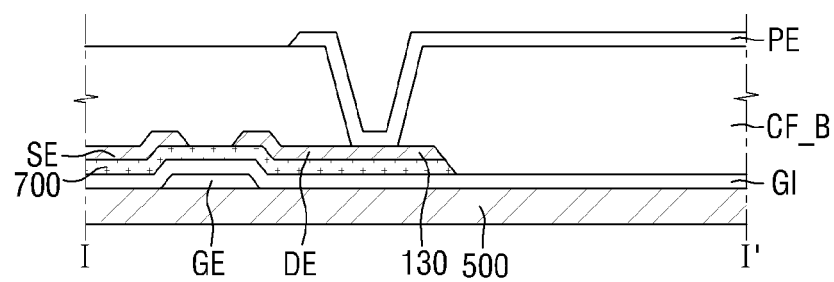
FIG. 8 is a cross-sectional view for illustrating a method of fabricating an LCD device according to an exemplary embodiment of the disclosure.
Figure 9:
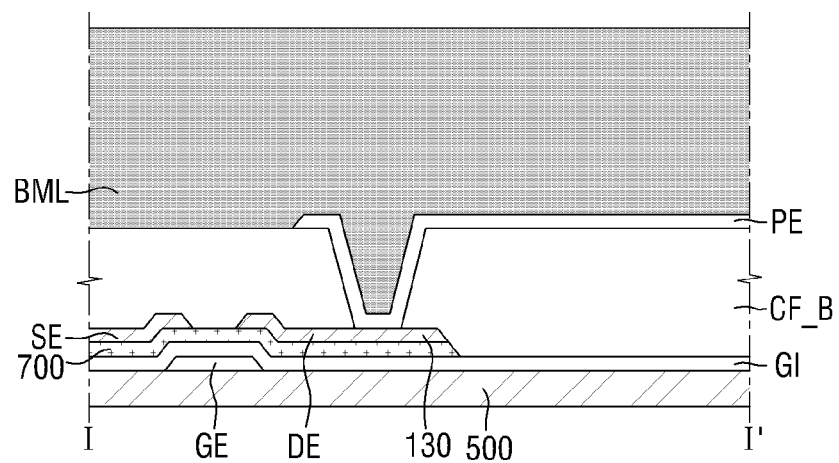
FIG. 9 is a cross-sectional view for illustrating a method of fabricating an LCD device according to an exemplary embodiment of the disclosure.
Figure 10:
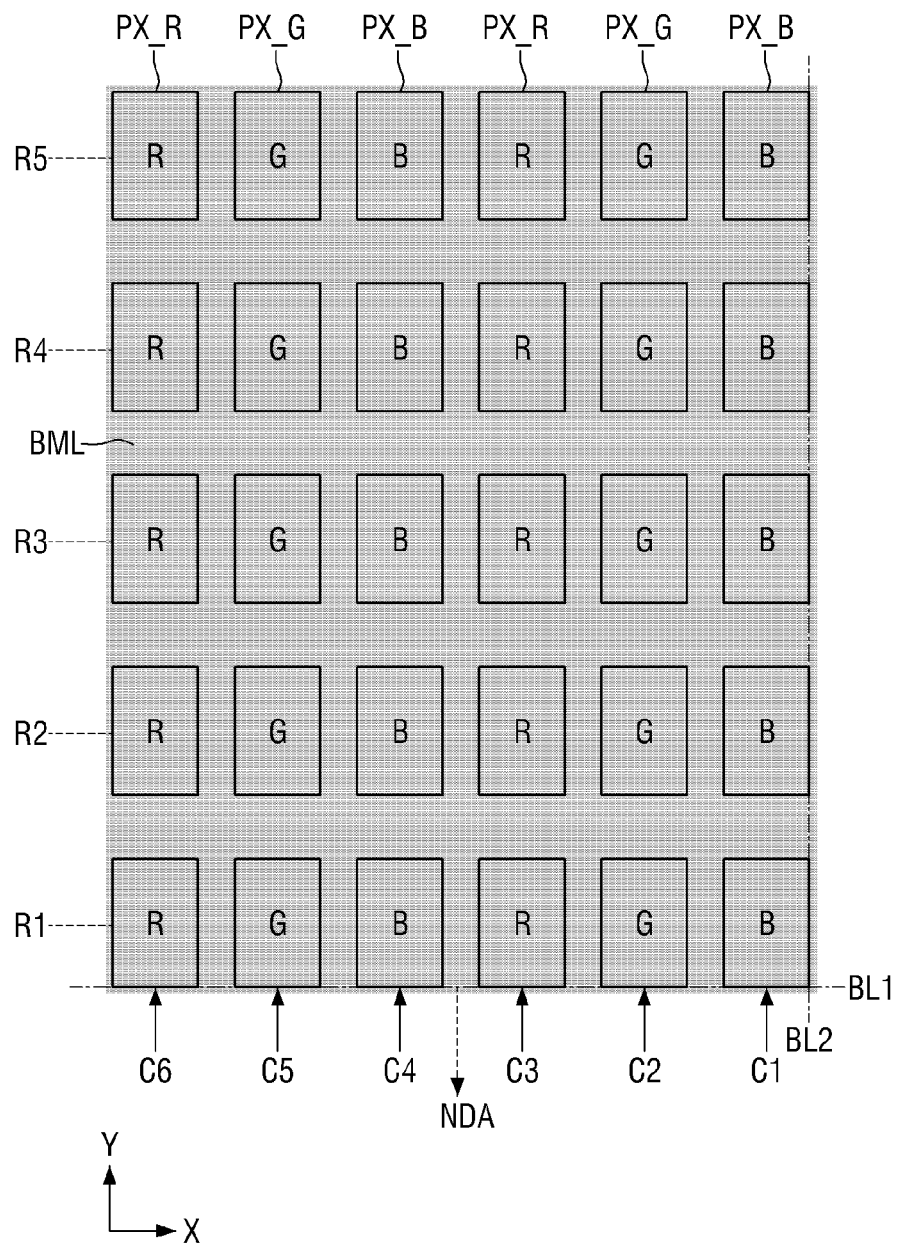
FIG. 10 is a schematic plan view for illustrating the method of fabricating an LCD device according to an exemplary embodiment of the disclosure.
Figure 11:
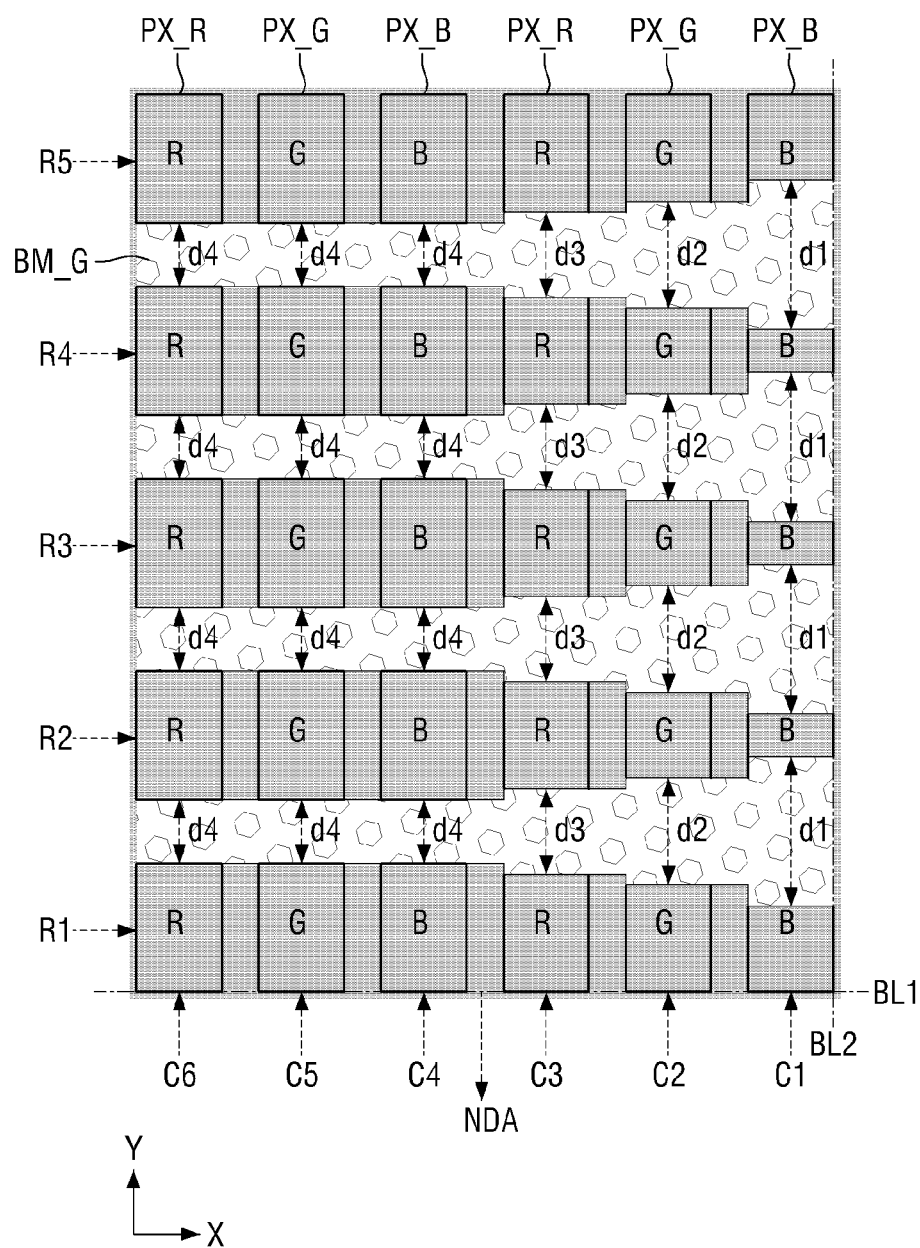
FIG. 11 is a schematic plan view for illustrating the method of fabricating an LCD device according to an exemplary embodiment of the disclosure.
Figure 12:
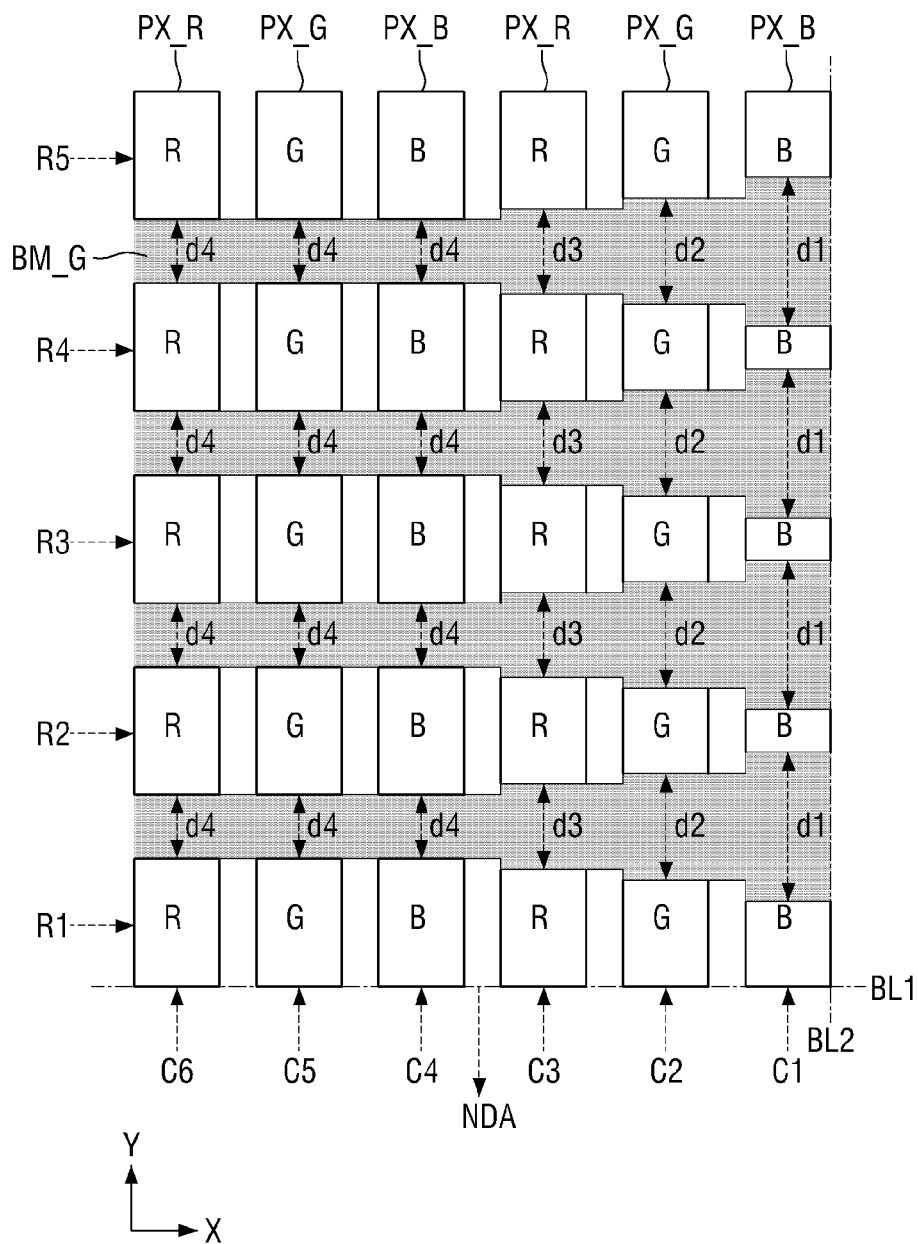
FIG. 12 is a schematic plan view for illustrating the method of fabricating an LCD device according to an exemplary embodiment of the disclosure.

FIGS. 8 and 9 are cross-sectional views for illustrating a method of fabricating an LCD device according to an exemplary embodiment of the disclosure. FIGS. 10 to 12 are schematic plan views for illustrating the method of fabricating an LCD device according to the exemplary embodiment of the disclosure.

Referring to FIGS. 8 to 12, an exemplary embodiment of the method of fabricating an LCD device includes: preparing a first substrate 500 on which a display area DA and a non-display area NDA surrounding the display area DA are defined; providing, e.g., forming, a light-blocking layer BML on the pixel electrode PE and the color filter CF on the first substrate 500; providing, e.g., forming, a photoresist pattern PR on the light-blocking layer BML; and etching the light-blocking layer BML using the photoresist pattern PR as an etch mask to form a black matrix BM. In such an embodiment, the first substrate 500 includes: gate lines GL extending in a first direction, data lines DL extending in a second direction and intersecting the gate lines GL; a color filter CF disposed on pixels each divided by the respective gate lines GL and data lines DL; and a pixel electrode PE disposed on the color filter CF. In such an embodiment, a width of the black matrix BM at a position adjacent to a boundary line between the display area DA and the non-display area NDA is larger than a width of the black matrix BM at a center portion of the display area DA.

In such an embodiment, referring to FIG. 8, the method includes preparing the first substrate 500, on which the display area DA and the non-display area NDA surrounding the display area DA. The first substrate 500 includes a gate line GL extending in the first direction, a data line extending in the second direction and intersecting the gate line GL, a color filter CF disposed on a pixel PX defined by the gate line GL and the data line DL, and a pixel electrode PE disposed on the color filter CF.

Gate wiring is provided, e.g., formed, on the first substrate 500 that includes a gate line GL and a gate electrode GE protruding from the gate line GL. The gate wiring may be substantially identical to that of an exemplary embodiment of the LCD device described above, and any repetitive detailed description thereof will be omitted.

A gate insulation film GI may be provided on the gate wiring GL and GE. The gate insulation film GI may cover the gate wiring GL and GE and may be formed throughout the entire surface of the first substrate 500.

The gate insulation film GI may be formed using at least one selected from: an inorganic insulative material such as silicon oxide ($SiO_x$) and silicon nitride ($SiN_x$); and an organic insulative material such as benzocyclobutene (BCB), an acryl-based material and polyimide. However, the material of the gate insulation film GI is not limited to those listed above.

A semiconductor pattern layer 700 may be provided on the gate insulation film GI.

The semiconductor pattern layer 700 may include amorphous silicon or polycrystalline silicon. However, the material of the semiconductor pattern layer 700 is not limited thereto but may include oxide semiconductor.

The data wiring DL, SE, DE and 130 may be provided or formed on the semiconductor pattern layer 700. In such an embodiment, as described above, the data wiring DL, SE, DE and 130 may include: a data line DL extending in the second direction to intersect the gate line GL; a source electrode SE branching off from the data line DL to be extended to the top of the semiconductor pattern layer 700; a drain electrode DE spaced apart from the source electrode SE and facing the source electrode SE on the semiconductor pattern layer 700 with respect to the gate electrode GE or the channel; and a drain electrode extension 130 extending from the drain electrode DE to be electrically connected to a pixel electrode PE.

The data lines DL, SE, DE and 130 may include a single film or multiple films including at least one of nickel (Ni), cobalt (Co), titan (Ti), silver (Ag), copper (Cu), molybdenum (Mo), aluminum (Al), beryllium (Be), niobium (Nb), gold (Au), iron (Fe), selenium (Se) and tantalum (Ta), for example. In such an embodiment, the material of the data wiring DL, SE, DE and 130 may include an alloy formed by adding at least one element selected from titanium (Ti), zirconium (Zr), tungsten (W), tantalum (Ta), niobium (Nb), platinum (Pt), hafnium (Hf), oxygen (O) and nitrogen (N) to a metal.

A color filter CF may be disposed over the data wiring DL, SE, DE and 130 and the semiconductor pattern layer 700. The color filter layer CF may include at least one of a blue color filter, a green color filter and a red color filter.

A contact hole CNT, via which the drain electrode extension 130 is exposed, may be formed in the color filter CF. The drain electrode extension 130 is exposed via the contact hole CNT, such that the pixel electrode PE may be electrically connected to the drain electrode DE, which will be described below.

The pixel electrode PE may be disposed on the color filter layer CF. The pixel electrode PE may be electrically connected to the drain electrode DE via the contact hole CNT formed in the color filter CF.

In an exemplary embodiment, the pixel electrode PE may include or be made of a transparent conductor such as ITO or IZO, or a reflective conductor such as aluminum.

Subsequently, referring to FIGS. 9 and 10, a light-blocking layer BML is provided or formed on the pixel electrode PE and the color filter CF on the first substrate 500.

The light-blocking layer BML is then subjected to pattering, to form a black matrix BM. Accordingly, the light-blocking layer BML may include or be made of substantially the same material as that of an exemplary embodiment of the black matrix BM of the LCD device described above.

The light-blocking layer BML may be provided or formed throughout the entire surface of the first substrate 500. In an exemplary embodiment, as shown in FIG. 10, the light-blocking layer BML may be formed to cover pixels arranged in a matrix form having columns and rows.

Subsequently, referring to FIG. 11, a photoresist pattern PR may be provided on the light-blocking layer BML. FIG. 11 shows a process of patterning the light-blocking layer BML to form a gate black matrix BM_G.

The photoresist pattern PR may correspond to the shape of the gate black matrix BM_G. In an exemplary embodiment, the photoresist pattern PR may extend in the first direction. The photoresist pattern PR may overlap the gate line GL. The width of the photoresist pattern PR may increase stepwise from the center portion of the display area DA to the second boundary line BL2. In such an embodiment, the width of the photoresist pattern PR at a location closest to the second boundary line BL2 may be larger than the width of the photoresist pattern PR in the center portion of the display area DA.

In such an embodiment, the width of the photoresist pattern PR disposed in the first column C1 may be larger than the width of the photoresist pattern PR disposed in the second column C2. In such an embodiment, the width of the photoresist pattern PR may decrease stepwise from the first column C1 to the fourth column C4.

As described above, the developing capability of a developer tends to be higher at the outer periphery of the display area DA than in the center portion of the display area DA. Accordingly, in an exemplary embodiment, by making the width of the photoresist pattern PR larger at the outer periphery of the display area DA, a sufficient width of the black matrix BM is secured even when the light-blocking layer BML is overly etched at the outer periphery of the display area DA. As a result, light leakage from the outer periphery of the display area DA may be effectively prevented.

Subsequently, referring to FIG. 12, the light-blocking layer BML is etched using the photoresist pattern PR as an etch mask, to form a black matrix BM.

The light-blocking layer BML is etched using the photoresist pattern PR as an etch mask, so that a gate black matrix BM_G may be formed.

When the width of the photoresist pattern PR is set to decrease stepwise from the first column C1 to the fourth column C4, the width of the gate black matrix BM_G conforming to the photoresist pattern PR may also decrease stepwise from the first column C1 to the fourth column C4. Specifically, the LCD device fabricated via the above processes may be substantially identical to that of the exemplary embodiment of the disclosure shown in FIG. 4.

Although the method has been described in terms of forming the gate black matrix BM_G, this is merely illustrative. It is to be understood that the method may be equally applied in forming a data black matrix BM_D.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A liquid-crystal display device comprising:
   a first substrate on which a display area and a non-display area surrounding the display area are defined;
   a plurality of gate lines disposed in the display area and extending in a first direction;
   a plurality of data lines disposed in the display area and extending in a second direction, wherein the data lines intersects the gate lines; and
   a black matrix extending in the first direction to cover the gate lines or in the second direction to cover the data lines,
   wherein a width of the black matrix at a location adjacent to a boundary line between the display area and the non-display area is larger than a width of the black matrix at a location adjacent to a center of the display area.

2. The liquid-crystal display device of claim 1, wherein the black matrix comprises a gate black matrix covering the gate lines.

3. The liquid-crystal display device of claim 2, further comprising:
   a source electrode and a drain electrode, which comprise substantially the same material as a material of the data lines.

4. The liquid-crystal display device of claim 3, wherein the gate black matrix covers the source electrode and the drain electrode.

5. The liquid-crystal display device of claim 3, further comprising:
   a color filter disposed on the source electrode and the drain electrode.

6. The liquid-crystal display device of claim 5, further comprising:
   a pixel electrode disposed on the color filter.

7. The liquid-crystal display device of claim 2, wherein the black matrix further comprises a data black matrix covering the data lines,
   wherein a width of the gate black matrix is larger than a width of the data black matrix.

8. The liquid-crystal display device of claim 1, wherein the display area and the non-display area are divided by first and second boundary lines, wherein the first boundary line extends in the first direction, and the second boundary line extends in the second direction,
   first to third columns extending in the second direction are defined in the display area sequentially from the second boundary line, and
   a width of the black matrix increases stepwise from in the third column to in the first column.

9. The liquid-crystal display device of claim 1, wherein the display area and the non-display area are divided by first and second boundary lines, wherein the first boundary line extends in the first direction, and the second boundary line extends in the second direction,
   first to third rows extending in the first direction are defined in the display sequentially from the first boundary line, and a width of the black matrix increases stepwise from in the third row to in the first row.

10. The liquid-crystal display device of claim 1, wherein the display area and the non-display area are divided by first and second boundary lines, wherein the first boundary line extends in the first direction and the second boundary line extends in the second direction, the black matrix comprises a gate black matrix extending in the first direction and a data black matrix extending in the second direction, the gate black matrix comprises an area in which a width thereof deceases from the second boundary line to the center of the display area, and the data black matrix comprises an area in which a width thereof deceases from the first boundary line to the center of the display area.

11. The liquid-crystal display device of claim 1, further comprising:

a plurality of pixels, each of which is connected to a corresponding data line and a corresponding gate line, wherein at least a portion of each of the plurality of pixels is exposed by the black matrix.

* * * * *